(12) United States Patent
Lee et al.

(10) Patent No.: US 7,960,797 B2
(45) Date of Patent: Jun. 14, 2011

(54) SEMICONDUCTOR DEVICES INCLUDING FINE PITCH ARRAYS WITH STAGGERED CONTACTS

(75) Inventors: John K. Lee, Boise, ID (US); Hyuntae Kim, Boise, ID (US); Richard L. Stocks, Boise, ID (US); Luan Tran, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 409 days.

(21) Appl. No.: 11/511,541

(22) Filed: Aug. 29, 2006

(65) Prior Publication Data

US 2008/0054483 A1 Mar. 6, 2008

(51) Int. Cl.
*H01L 23/528* (2006.01)

(52) U.S. Cl. ........ 257/382; 257/383; 257/758; 257/773; 257/774; 257/775; 257/E23.145; 257/E23.151

(58) Field of Classification Search ............... 257/758, 257/773, 383, 382, 774, 775, E23.145, E23.151
See application file for complete search history.

(56) References Cited

U.S. PATENT DOCUMENTS

| | | | | |
|---|---|---|---|---|
| 4,267,632 | A * | 5/1981 | Shappir | 438/257 |
| 5,827,776 | A | 10/1998 | Bandyopadhyay et al. | |
| 6,016,000 | A * | 1/2000 | Moslehi | 257/522 |
| 6,392,299 | B1 | 5/2002 | Gayet | |
| 6,528,368 | B1 * | 3/2003 | Park | 438/253 |
| 6,562,695 | B1 * | 5/2003 | Suzuki et al. | 438/424 |
| 6,617,211 | B1 * | 9/2003 | Niuya | 438/253 |
| 6,690,053 | B2 * | 2/2004 | Amo et al. | 257/306 |
| 2002/0134997 | A1 | 9/2002 | Ito et al. | |
| 2004/0183113 | A1 | 9/2004 | Park et al. | |
| 2005/0098814 | A1 * | 5/2005 | Hideki | 257/298 |
| 2005/0245026 | A1 * | 11/2005 | Kim et al. | 438/253 |
| 2007/0049035 | A1 * | 3/2007 | Tran | 438/696 |
| 2007/0241378 | A1 * | 10/2007 | Aritome | 257/295 |

OTHER PUBLICATIONS

Austin et al., 6 nm half-pitch lines and 0.04 .mu.m$^2$ static random access memory patterns by nanoimprint lithography, May 12, 2005, Nanotechnology, 16, 1058-1061.*
"Damascene: Optimized Etch Stop Structure and Method," IBM Technical Disclosure Bulletin, IBM Corp., New York, U.S., vol. 36, No. 11 (Nov. 1993), p. 649.
"Displaced Metal Conductor," IBM Technical Disclosure Bulletin, IBM Corp., New York, U.S. vol. 36, No. 11 (Nov. 1993), pp. 599-602.
International Search Report dated Apr. 17, 2008, for International Application No. PCT/US2007/076970 (4 pages).
PCT Written Opinion for International Application No. PCT/US2007/076970, mailed Apr. 17, 2008.
PCT International Search Report on Patentability for International Application No. PCT/US2007/076970, issued Mar. 3, 2009.

* cited by examiner

*Primary Examiner* — Jerome Jackson, Jr.
*Assistant Examiner* — Yu Chen
(74) *Attorney, Agent, or Firm* — TraskBritt

(57) ABSTRACT

A semiconductor device structure includes staggered contacts to facilitate small pitches between active-device regions and conductive lines while minimizing one or both of misalignment during fabrication of the contacts and contact resistance between sections of the contacts. The contacts of one row communicate with every other active-device region and are staggered relative to the contacts of another row, which communicate with the remaining active-device regions. Each contact may include a relatively large contact plug with a relatively large upper surface to provide a relatively large amount of tolerance as a contact hole for an upper portion of the contact that is formed. The contact holes may be formed substantially simultaneously with trenches for conductive traces, such as bit lines, in a dual damascene process. Intermediate structures are also disclosed, as are methods for designing semiconductor device structures.

18 Claims, 8 Drawing Sheets

SEMICONDUCTOR DEVICES INCLUDING FINE PITCH ARRAYS WITH STAGGERED CONTACTS

BACKGROUND OF THE INVENTION

1. Field of the Invention

The present invention relates generally to semiconductor devices that include fine pitch arrays and, more specifically, semiconductor devices that include contacts that are arranged to facilitate an increase in density and a decrease in pitch of such arrays, as well as an effective decrease in pitch of contacts of such arrays. More specifically, the present invention relates to semiconductor devices with staggered contacts.

2. Background of Related Art

The dimensions of many features of semiconductor devices are ever-decreasing to facilitate increases in feature, or device, densities. Each time another decrease in feature dimensions is accomplished, a variety of challenges have been overcome.

A current challenge in decreasing device dimensions has been presented by the fabrication of conductive structures, referred to in the art as "contacts," that are used to establish conductive links between bit lines and corresponding conductively doped active-device regions in a semiconductor substrate. Due to limitations in the height-aspect ratios that may be achieved by state-of-the-art etch processes, contact holes having sufficient dimensions at the bases thereof cannot be formed. As a result, contact holes are formed in two or more process steps. Initially, a base portion of each contact hole is fabricated in a base layer of dielectric material. The base of the contact hole is filled with conductive material, which forms a so-called conductive "plug" in the contact hole, which is in electrical communication with the underlying active-device region. One or more upper layers of dielectric material are then formed over the base layer of dielectric material and the conductive plugs that extend therethrough. An upper portion of each contact hole is then formed through the one or more upper layers of dielectric material. In order to properly align the upper portion of each contact hole with its corresponding plug, the dimensions across the bottom of the upper portion of each contact hole must be significantly smaller than the dimensions across the top of the conductive plug. If the dimensions of across the top surface of each conductive plug are too small, misalignment may occur and a contact formed in the upper portion of each contact hole may not communicate electrically or establish sufficient electrical communication with its corresponding conductive plug. If the dimensions across the bottom of the upper portion of each contact hole are too small, contact resistance between a contact formed therein and the conductive plug may be undesirably high.

Accordingly, there are needs for contact structures and contact fabrication processes that facilitate a continued decrease in the dimensions of features of semiconductor device structures.

BRIEF DESCRIPTION OF THE DRAWINGS

In the drawings, which depict examples of various aspects of the present invention:

FIGS. 4 through 19 depict examples of fabrication of semiconductor device structures including staggered contacts.

DETAILED DESCRIPTION

The present invention includes semiconductor device structures with feature densities that are not limited by the presence of the contacts thereof. In addition, the present invention includes methods for fabricating semiconductor device structures.

In one aspect, a semiconductor device structure according to the present invention includes staggered contacts. By staggering the contacts, a desired, state-of-the-art pitch may be achieved or maintained in active-device regions and bit lines without compromising the efficiency with which such devices may be fabricated or their reliability. As used herein, the term "semiconductor device structure" includes wafers and other bulk semiconductor substrates, partial wafers, groups of dice, and singulated dice. Such semiconductor device structures comprise both completed, packaged and unpackaged, integrated circuits, as well as in-process semiconductor device structures.

For example, a semiconductor device structure that incorporates teachings of the present invention may include contacts with conductive plugs that have widths that approach or even exceed the pitches of the active-device regions or bit lines of the structure. The relatively large conductive plugs may have upper surfaces with dimensions that prevent or eliminate the possibility that the overlying portions of corresponding contacts may be misaligned therewith. Additionally, or alternatively, the dimensions of the upper surfaces of the conductive plugs and the corresponding dimensions across the bottom of the upper portion of each contact hole may be large enough to prevent an undesirably large amount of contact resistance between a contact within the upper portion and the conductive plug.

Another aspect of the present invention includes methods for fabricating contacts of semiconductor device structures. Such a method may employ a so-called "dual damascene" methodology, in which trenches and/or apertures are formed that extend to two or more different fabrication levels, or elevations, of a semiconductor device structure. The trenches and/or apertures are then filled with conductive material. In an example of a method that is within the scope of the present invention, bit line trenches are formed, as are contact holes that are aligned with and extend from the bit line trenches to underlying conductive plugs. When such techniques are employed, the alignment tolerances of lithography apparatus are effectively increased.

Intermediate structures that are formed during such methods are also within the scope of the present invention. Without limiting the scope of the present invention, the invention includes intermediate semiconductor device structures that include material layers that serve multiple functions. For example, a single material layer may serve as an etch stop, a hard mask, and a polish stop at different points in a fabrication process.

In another aspect, the present invention includes methods for designing semiconductor device structures with offset contacts.

Other features and advantages of the present invention will become apparent to those of ordinary skill in the art through consideration of the ensuing description, the accompanying drawings, and the appended claims.

Details of various aspects of the present invention are described hereinafter, with reference to the drawings.

Figure 1:
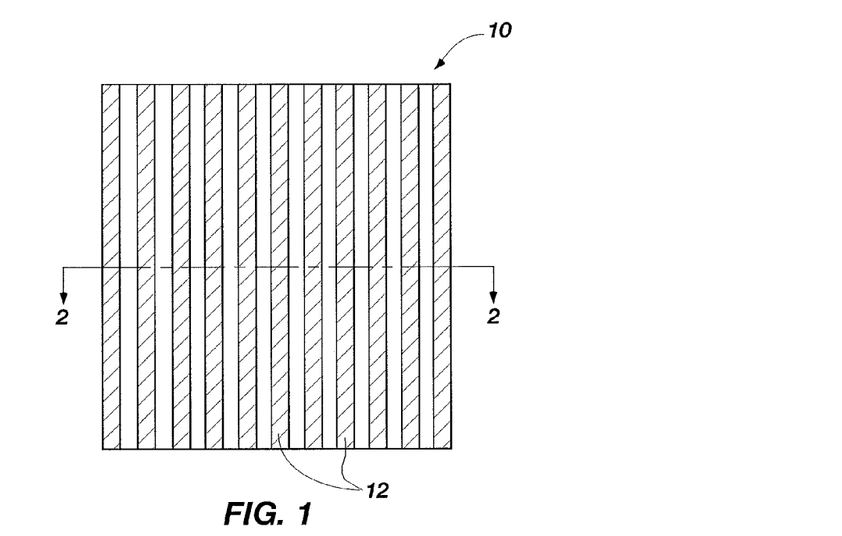
FIG. 1 is a schematic representation of the manner in which active areas, or active-device regions, which include conductively doped semiconductor material, are arranged on at least a portion of a semiconductor substrate.

FIG. 1 is a schematic representation of the active areas 12, which are also referred to herein as "active-device regions," in a semiconductor substrate 10, with only a small portion of semiconductor substrate 10 shown. The term "semiconductor substrate" as used herein encompasses semiconductor dice, semiconductor wafers, partial wafers, and other bulk semiconductor substrates as well as devices and groups of devices singulated therefrom. As illustrated, active areas 12 are elongate elements that comprise conductively doped regions of the semiconductor substrate 10. These elongate elements may be oriented parallel to one another. In semiconductor devices in which current state-of-the-art technologies are incorporated, active areas 12 may have widths of as small as about 10 nm and may be spaced a distance as small as about 50 nm or less (e.g., 10 nm) apart from one another. Thus, their pitch may be as small as about 60 nm or less (e.g., about 20 nm). Of course, active areas 12 may be wider or narrower than 10 nm and may be spaced more or less than 50 nm apart from one another without departing from the scope of the present invention.

Figure 2:
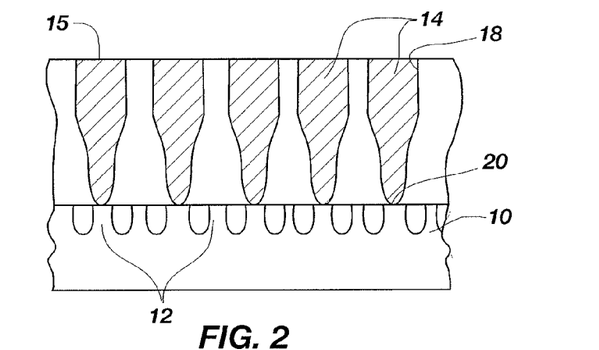
FIG. 2 is a partial cross-sectional representation of a partially fabricated semiconductor device structure including conductive plugs that are offset or staggered relative to one another, with a row of conductive plugs communicating with every other active-device region of a series of active-device regions of a semiconductor substrate.

In FIG. 2, which is a cross-section through a semiconductor device and illustrates a plane-oriented perpendicular to the plane shown in FIG. 1 in the general orientation shown by line 2-2 of FIG. 1, active areas 12 extend into and out of the plane of the figure. In addition, FIG. 2 shows a contact plug 14 positioned over and in communication with every other, or every second, active area 12. This is because each contact plug 14 has a maximum diameter that approaches or even exceeds the pitch of active areas 12, but adjacent contact plugs 14 must be electrically isolated from one another. The relatively large size of each contact plug 14 minimizes contact resistance between the contact plugs 14 and the active areas 12 to which they are electrically connected. Contact plugs 14 for the remaining active areas 12, which are depicted in phantom, are positioned just behind or just in front of the plane of FIG. 2.

Figure 3:
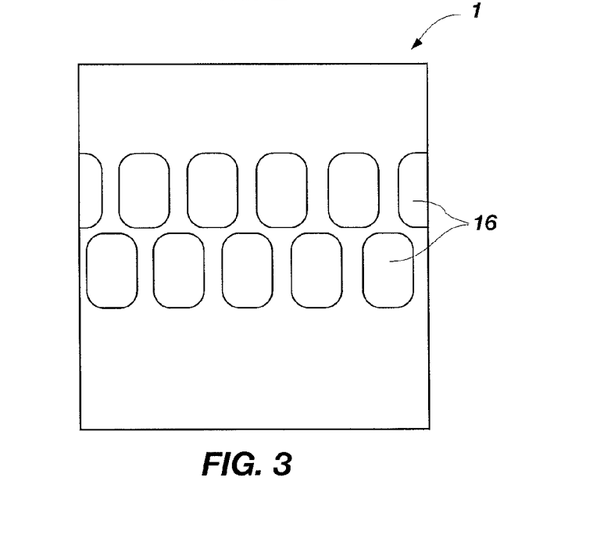
FIG. 3 is a schematic representation of a portion of a semiconductor device structure illustrating the manner in which the conductive plugs of FIG. 2 and overlying contact holes and contact apertures may be staggered.

The staggering of contact plugs 14 and the contact holes 16 positioned above contact plugs 14 (FIG. 2) is shown in FIG. 3, which is a top view of a partially fabricated semiconductor device 1. The pitches of contact holes 16 and contact plugs 14 may be about twice the pitch of active areas 12 (e.g., if the pitch of active areas is about 100 nm, the pitches of contact plugs 14 and contact holes 16 may be about 200 nm, if the pitch of active areas is about 20 nm, the pitches of contact plugs 14 and contact holes 16 may be about 40 nm). As depicted, contact holes 16 are staggered in such a way that they align with their corresponding contact plugs 14. Continuing with the above-noted exemplary dimensions, contact holes 16 may be about 100 nm or more across (e.g., in diameter or width) at the tops 18 thereof and about 30 nm across (e.g., in diameter) at the bases 20 thereof, which expose upper surfaces 15 (FIG. 2) of contact plugs 14. The relative dimensions of the upper surfaces 15 of contact plugs 14 and the bases 20 of contact holes 16 (e.g., an upper surface 15 with a width that is about two or three times as large as the distance across a corresponding base) provides a relatively great deal of tolerance in aligning contact holes 16 with contact plugs 14 and may minimize contact resistance between contact plugs 14 and contacts (not shown in FIG. 3) that are subsequently formed on top of contact holes 16.

Although oval contact holes 16 are depicted, contact holes having other cross-sectional shapes relative to the heights or lengths thereof, are also within the scope of the present invention. For example, contact holes 16 may have circular cross-sectional shapes, which may be used to further increase density in a direction along which active areas 12 extend, which is transverse to the plane of FIG. 2.

Without limiting the scope of any aspect of the present invention, each contact plug 14 may comprise a unitary structure or include a lower portion (not shown), which contacts a corresponding active area 12, and an upper portion. Examples of materials that may be used to form a unitary contact plug 14 or at least the lower portion of a contact plug 14 include, but are not limited to, tungsten (W) and conductively doped polysilicon. Of course, the upper portion of a contact plug 14 may also be formed from tungsten, as well as a variety of other materials, including, without limitation, copper, aluminum (which may be introduced by flow or deposition processes), nickel, or any other suitable material that is structurally stable and has low contact resistance with adjacent materials (e.g., the material or materials of active areas 12 and of conductive lines 68 (FIGS. 18-20)).

Turning now to FIGS. 4 through 19, an example of a process for fabricating semiconductor device structures that incorporate teachings of the present invention is depicted. As recognized by those of ordinary skill in the art, the fabrication process may, and generally would, be conducted at the wafer or other bulk semiconductor substrate level, so that a large number of semiconductor devices may be simultaneously fabricated and provided with the features of the present invention.

Figure 4:
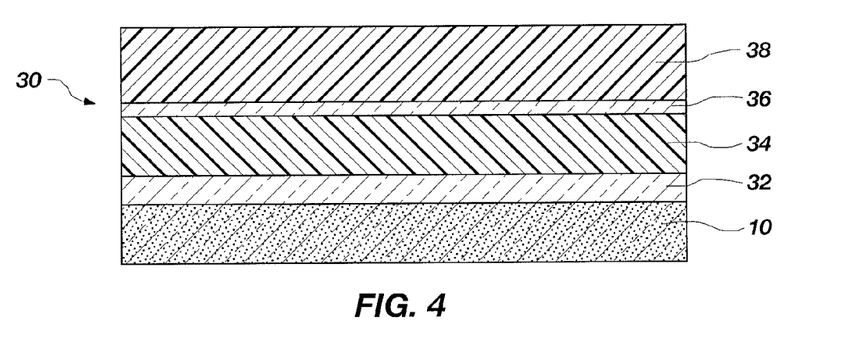

In FIG. 4, a structure 30 is depicted that includes a semiconductor substrate 10 and at least one structural layer 32 formed over semiconductor substrate 10 that includes insulative material (e.g., doped silicon dioxide, undoped silicon dioxide, etc.) that electrically isolates adjacent conductive structures (e.g., contact plugs 14 (FIG. 2), etc.) from one another. Any other suitable, conventional processes (including, without limitation, material deposition, masking, etching, polishing or planarization, etc.) may be used to structures that include contact plugs 14, with the masks that are used in such processes being configured to stagger contact plugs 14.

An insulative layer 34 (e.g., a layer including doped silicon dioxide, undoped silicon dioxide, a low-k dielectric, etc.) is disposed over structural layer 32. Insulative layer 34 may be formed by known processes, including, without limitation, deposition techniques (e.g., decomposition of tetraethyl-ortho-silicate (TEOS), etc.), as spin-on glass (SOG), and the like.

An etch stop layer 36 (e.g., a silicon nitride film, etc.) is located over structural layer 32. Etch stop layer 36 is referred to as such because it is to be employed as an etch stop in a subsequent (e.g., dual damascene) etch process. Depending upon the material or materials from which it is formed, etch stop layer 36 may also act as an antireflective coating (ARC) for subsequent use in patterning a layer 38 of photoresist to form a photomask 40 (see FIG. 5). Optionally, one or more other ARCs (not shown) may be formed before or after forming etch stop layer 36.

Figure 5:
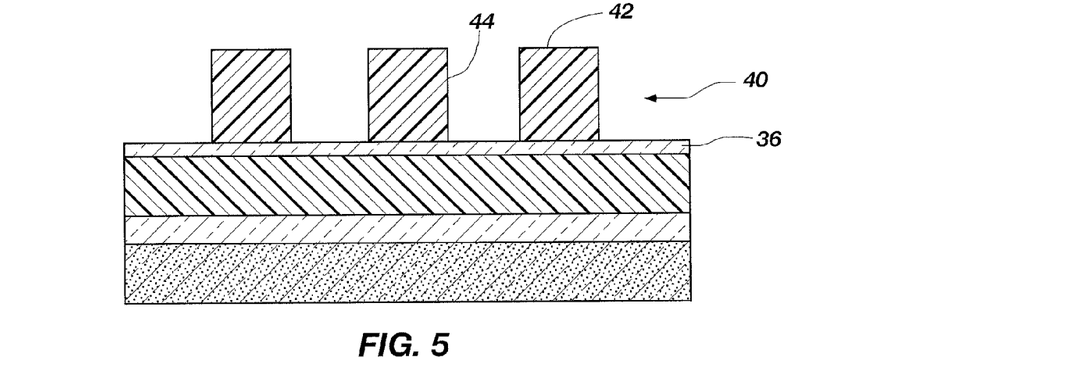

With continued reference to FIG. 4, a layer 38 of photoresist is applied over etch stop layer 36 (e.g., by spin-on techniques, spray-on techniques, or any other suitable application process). Known processes (e.g., exposure and development processes, etc.) are then used to pattern layer 38 of photoresist to form a photomask 40 therefrom, as shown in FIG. 5. Photomask 40 includes solid regions 42, including solid regions positioned laterally outside of an array of contact plugs 14, that are positioned and configured to prevent or limit removal of certain areas of the underlying etch stop layer 36 (e.g., by preventing or limiting their exposure to one or more etchants, solvents, plasmas, etc.). Apertures 44 of photomask 40 are positioned and configured to facilitate removal of other areas of the underlying etch stop layer 36.

Figure 6:
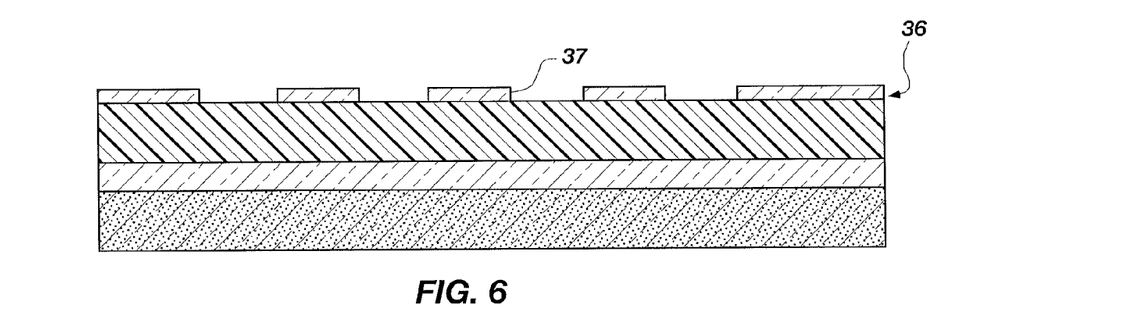
Figure 7:
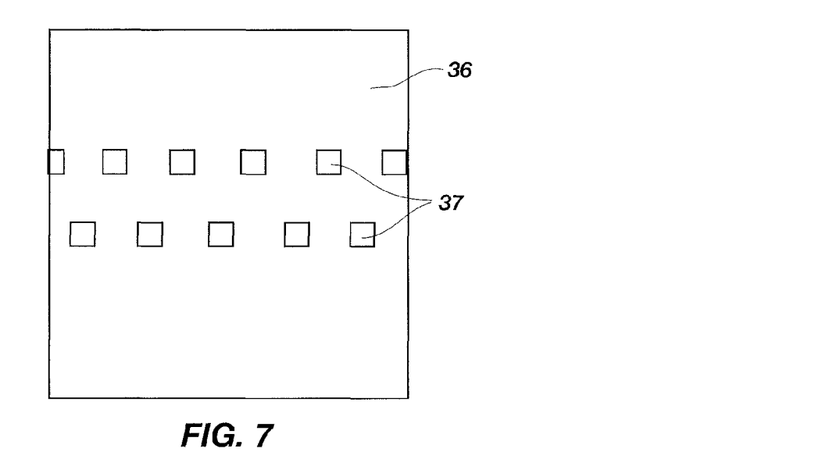

Once photomask 40 or another suitable mask has been formed over etch stop layer 36, desired regions (i.e., the "other regions" referred to above) of etch stop layer 36 may be removed, as FIG. 6 illustrates, to form apertures 37 therein. Removal may be effected by any suitable process, including, without limitation, by wet or dry etch processes or otherwise, as known in the art. The apertures 37 of etch stop layer 36 may be arranged in a somewhat staggered relation, such as those shown in FIGS. 3 and 7. As will be better understood after a review of a later portion of this disclosure, etch stop layer 36 prevents material of underlying layers, films, or structures from being undesirably removed.

Figure 8:
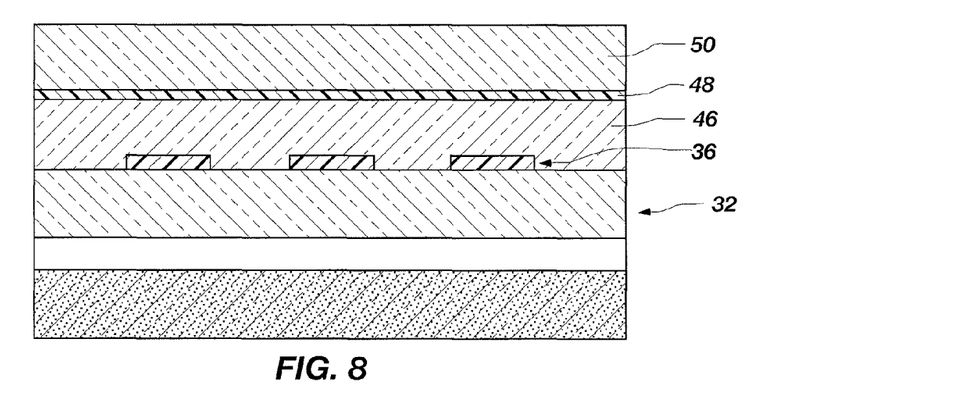
Figure 18:
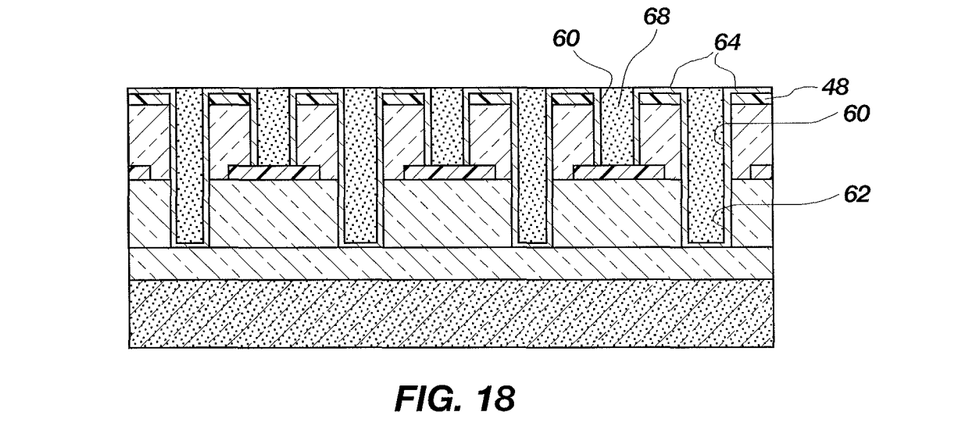
Figure 19:
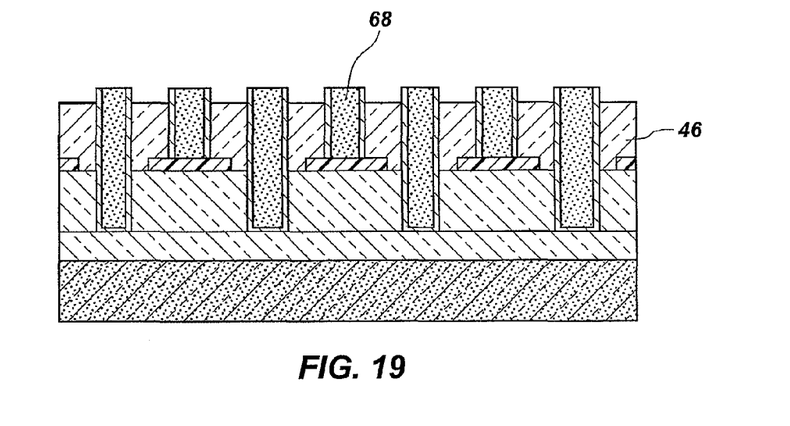
Figure 20:
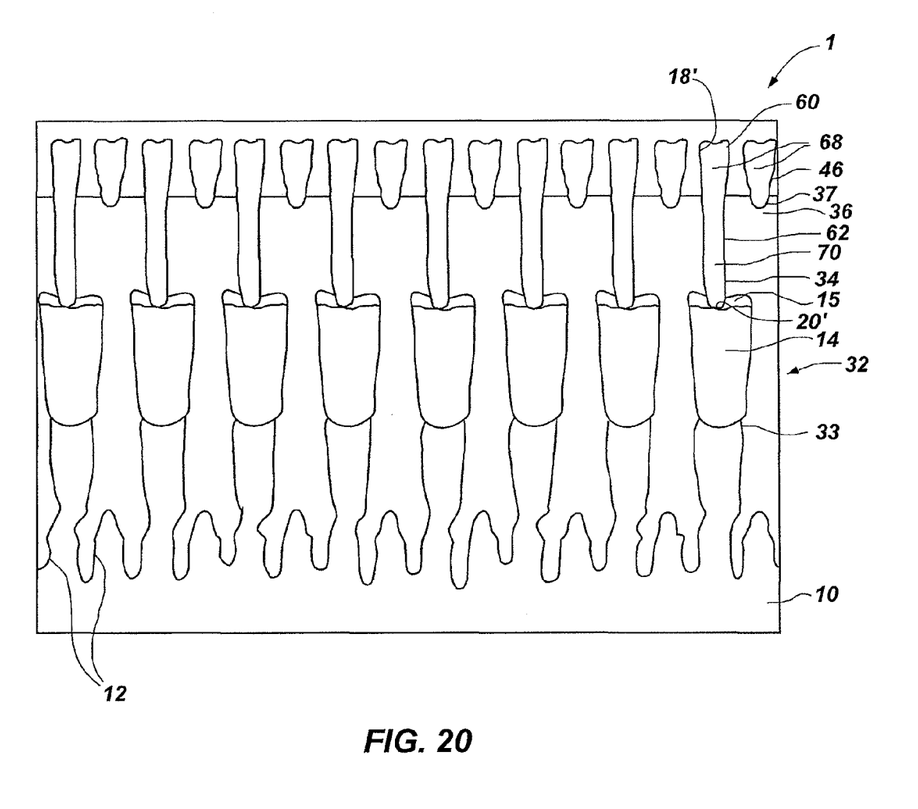
FIG. 20 is an electron micrograph of a cross-section of a semiconductor device structure that incorporates teachings of the present invention.

After etch stop layer 36 has been patterned, a dielectric layer may be formed thereover, as shown in FIG. 8. By way of nonlimiting example, dielectric layer 46 may include a doped silicon dioxide (e.g., borophosphosilicate glass (BPSG), phosphosilicate glass (PSG), borosilicate glass (BSG), etc.), spin-on glass (SOG), a low-k dielectric, or the like. The thickness of dielectric layer 46 may be tailored for a variety of purposes. Such purposes include, but are not limited to, facilitating the formation of contact holes 62 (FIG. 16) with desired dimensions at the tops and bottoms thereof, preventing polymer from backfilling contact holes 62 too quickly as the material of etch stop layer 36 is exposed to an etchant that removes the material of dielectric layer 46, minimizing electrical interference between conductive features located on opposite sides of dielectric layer 46, facilitating the subsequent introduction of conductive material into contact holes 62, and defining the heights of conductive lines 68 (FIGS. 18-20).

A mask 50m (see FIG. 10), or "mandrel," may be formed over dielectric layer 46. With continued reference to FIG. 8, mask 50m may be formed by sequentially forming a hard mask 48 and an intermediate mask layer 50 over the etch stop layer 36 and regions of structural layer 32 that are exposed through etch stop layer 36. Hard mask layer 48 may comprise any material suitable for use as a hard mask, such as polysilicon, silicon nitride, silicon carbide, SiCN, Al$_2$O$_3$, a dielectric antirefelective coating (DARC) layer, a silicon-rich oxide, nitride, or oxynitride, or the like. As will be seen, hard mask layer 48 is employed as an etch stop, a hard mask, and a polishing stop for subsequent removal processes. Intermediate mask layer 50 may comprise a carbon-based layer (e.g., transparent carbon (TC)), amorphous carbon, a so-called "spin-on hard mask," etc.), a so-called "multi-layer resist," a single-level resist, or the like. Silicon may or may not be dispersed throughout the material of intermediate mask layer 50. Optionally, one or more ARCs (not shown) may be formed over and/or below intermediate mask layer 50.

Figure 9A:
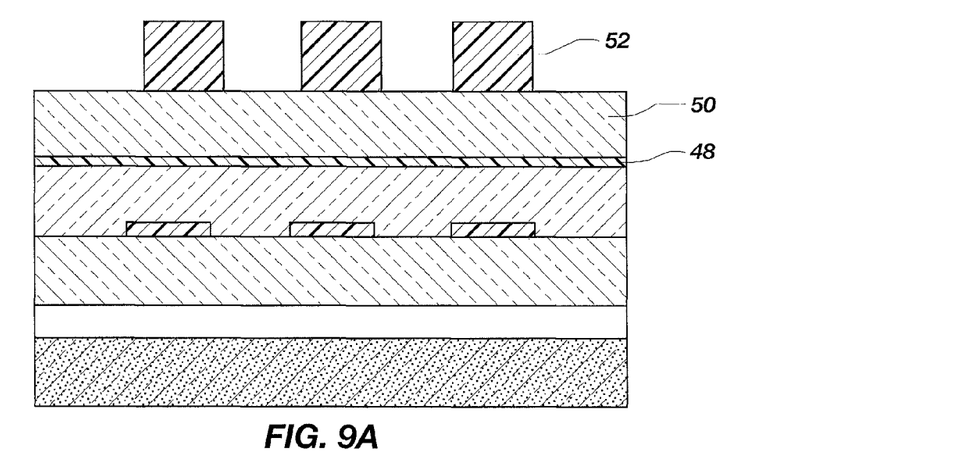
Figure 9B:
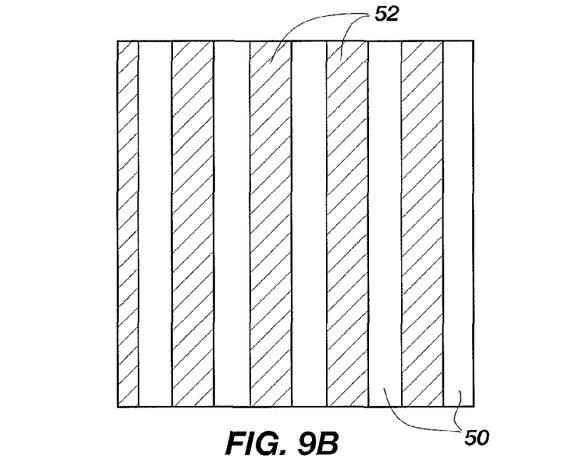

Additionally, as shown in FIGS. 9A and 9B, a photomask 52 may be formed over intermediate mask layer 50 to facilitate patterning of the one or more sublayers of hard mask 48 and intermediate mask layer 50. Alternatively, photomask 52 may be formed directly on dielectric layer 46 (not shown). As shown, photomask 52 has been applied and patterned by known processes.

Figure 10:
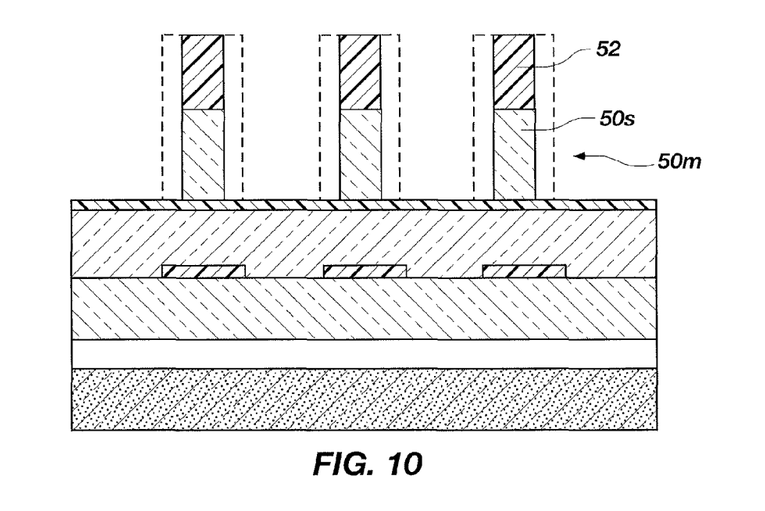

The general pattern of photomask 52 may be transferred to the underlying intermediate mask layer 50, as illustrated in FIG. 10. Any suitable process, including, without limitation, known etching processes (e.g., so-called "dry develop" processes, plasma etch processes, resist and/or carbon-based layer (e.g., TC, etc.) trim processes, etc.), may be used to substantially transfer the pattern of photomask 52 to intermediate mask layer 50. Hard mask 48 may act as an etch stop for this pattern-transferring process. Intermediate mask layer 50 may also be "trimmed," as known in the art, to reduce and/or refine dimensions of the solid regions 50s thereof. The resulting mask 50m is more rigid and has higher etch resistances than photomask 52, and critical dimensions of mask 50m may be more easily tailored and controlled than those of photomask 52.

Figure 11:
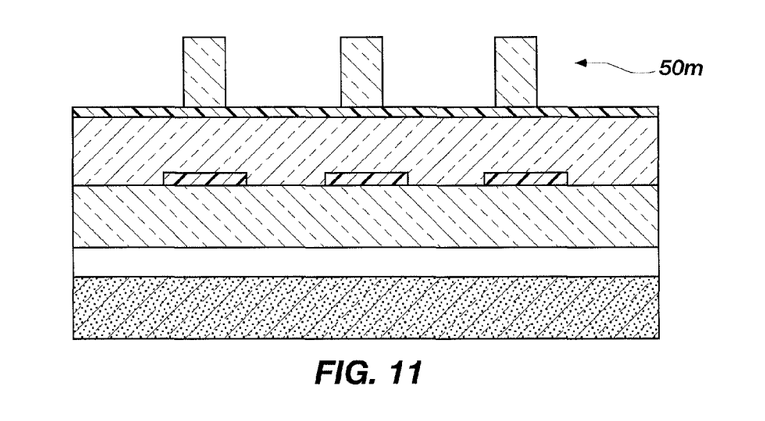

Any remnants of photomask 52 may be consumed as mask 50m is formed from intermediate mask layer 50, as shown in FIG. 11.

Figure 12:
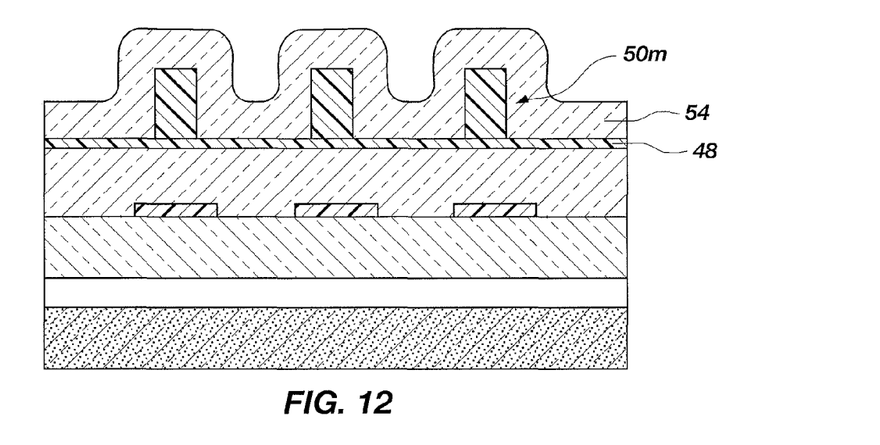

Next, as depicted in FIG. 12, an oxide layer 54 (e.g., doped or undoped silicon dioxide, etc.) is formed over mask 50m and portions of hard mask 48 that are exposed through mask 50m. Oxide layer may be formed by any suitable process, including, but not limited to, low temperature and conformal deposition techniques, such as an atomic layer deposition (ALD) process or another suitable deposition technique.

Figure 13:
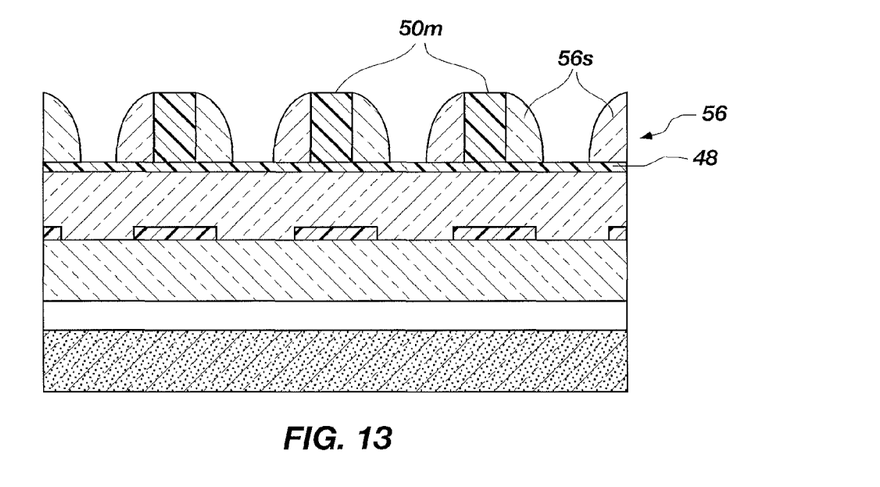

After oxide layer 54 is formed, a spacer etch is conducted, as illustrated in FIG. 13. As those of ordinary skill in the art are aware, a spacer etch is an anisotropic etch process. Hard mask 48 may act as an etch stop during the spacer etch process. The spacer etch process removes the relatively thin portions of oxide layer 54, including portions thereof that are located over solid regions of mask 50m, as well as portions of oxide layer 54 that are located over hard mask 48, between adjacent solid regions of negative mask 50m. The result is the spacer mask 56, including individual spacers 56s, that is illustrated in FIG. 13.

Alternatively, a spacer mask 56 may be formed from a material with sufficient resistance to the etchant or etchants that are used to remove material from dielectric layer 46 and structural layer 32, negating the need for hard mask 48.

Figure 14:
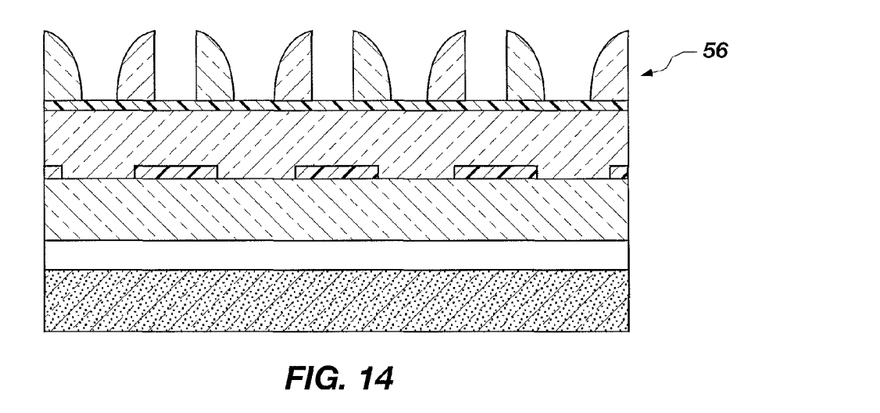

The remaining solid regions of mask 50m (FIG. 13), which are exposed through spacer mask 56, are removed by suitable processes, as shown in FIG. 14. The processes that are used depend, of course, upon the material or materials from which mask 50m is formed. For example, if mask 50m (FIG. 12) is formed from a carbon-based material (e.g., resist, spin-on hard mask, TC, amorphous carbon, etc.) a suitable plasma strip (e.g., with an oxygen plasma), or etch, process may be employed. As another alternative, if a multi-layer resist is employed to form mask 50m, one or more suitable resist strippers may be used to remove the remaining solid regions thereof.

Figure 15:
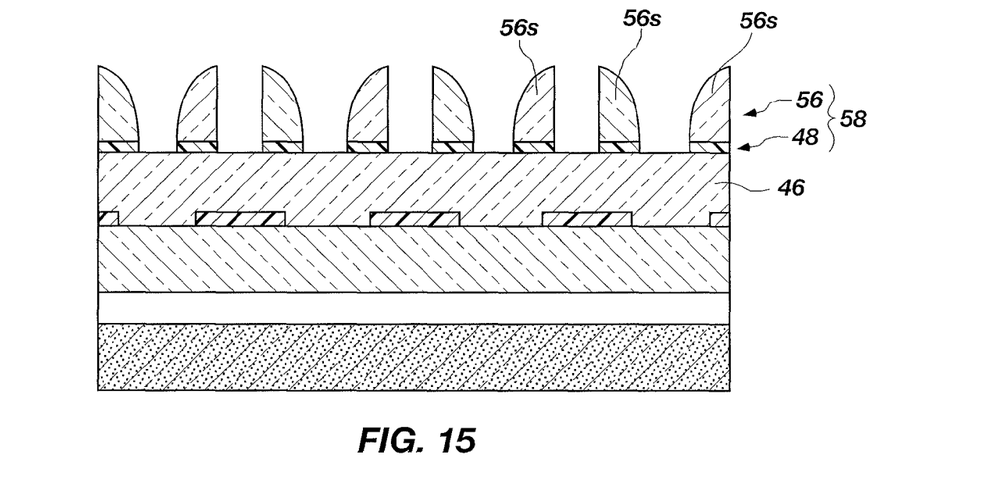

Thereafter, as depicted in FIG. 15, regions of hard mask 48 that are exposed between spacers 56s (i.e., that are exposed through spacer mask 56) are removed to exposed portions of the underlying dielectric layer 46. The remaining portions of hard mask layer 48 and the overlying spacer mask 56 collectively form a hard mask 58, through which patterning of dielectric layer 46 and underlying structures may be effected.

Figure 16:
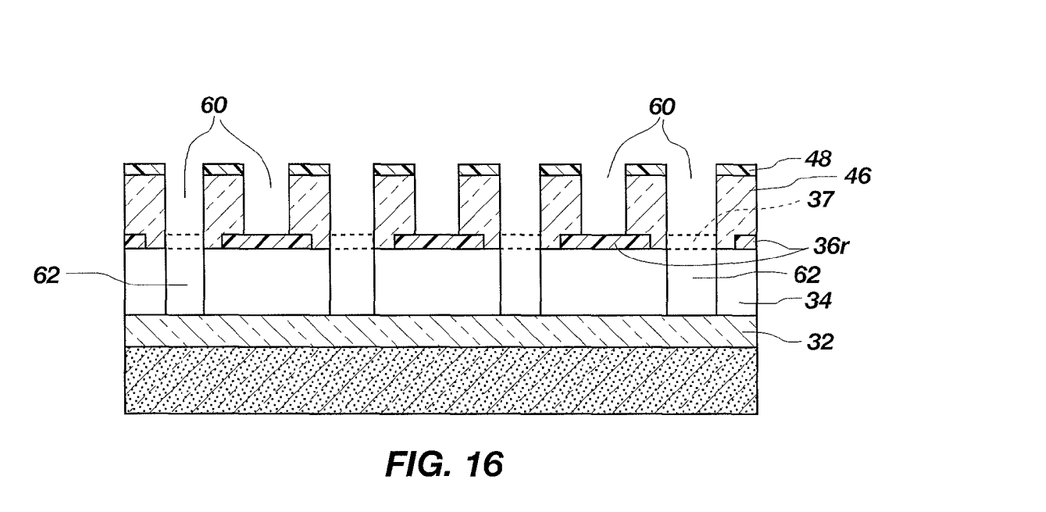

Turning now to FIG. 16, trenches 60 and contact holes 62 may be substantially concurrently formed. Trenches 60, in which conductive lines 68 (FIG. 18) may be subsequently formed, extend into dielectric layer 46 as far down as remaining regions 36r of etch stop layer 36. Contact holes 62, within which conductive contacts 70 (FIG. 18) may later be formed, are located beneath and communicate with corresponding trenches 60 and are positioned over contact plugs 14. Each contact hole 62 extends through a portion of the elevation of dielectric layer 46 that resides in the same plane as etch stop layer 36 (e.g., through apertures 37 in etch stop layer 36), and through insulative layer 34 to expose conductive structures (e.g. contact plugs 14 (see FIG. 2) within structural layer 32.

Removal of material from dielectric layer 46 and from insulative layer 34 may be effected with a suitable etchant or combination of etchants. Of course, the etchant or etchants employed remove material of dielectric layer 46 and insulative layer 34 with selectivity over, or at a greater rate than, the etchant or etchants remove the materials of hard mask layer 48 and of remaining regions 36r of etch stop layer 36. The removal process may also substantially simultaneously remove the material of spacer mask 56. For example, $C_4F_8/C_4F_6/O_2$ may be used to remove material from dielectric layer 46 and insulative layer 34 if dielectric layer 46 and insulative layer 34 include silicon dioxide. $C_4F_8/C_4F_6/O_2$ removes silicon dioxide with selectivity over silicon nitride, from which one or both of hard mask layer 48 and remaining regions 36r of etch stop layer 36 may be formed.

As the contact holes 62 are located at a greater depth than trenches 60, one of ordinary skill in the art will readily understand that the formation of contact holes 62 may continue (and, in some instances, not even begin) until after trenches 60 have been completely formed, but that contact holes 62 are nonetheless formed substantially concurrently or substantially simultaneously with the formation of trenches 60.

The dimensions across the bottom end of each contact hole 62 may be large enough (e.g., about 30 nm) to minimize contact resistance between a conductive contact subsequently formed within each contact hole 62 and upper surface 15 of its corresponding contact plug 14 (FIG. 2). In addition, the relatively large upper surfaces 15 of contact plugs 14 may facilitate alignment or registration of contact holes 62 with contact plugs 14, even when the overlying mask layers are slightly misaligned with the features over which the mask layers are formed.

Notably, hard mask layer 48 may remain on the resulting structure shown in FIG. 16.

Figure 17:
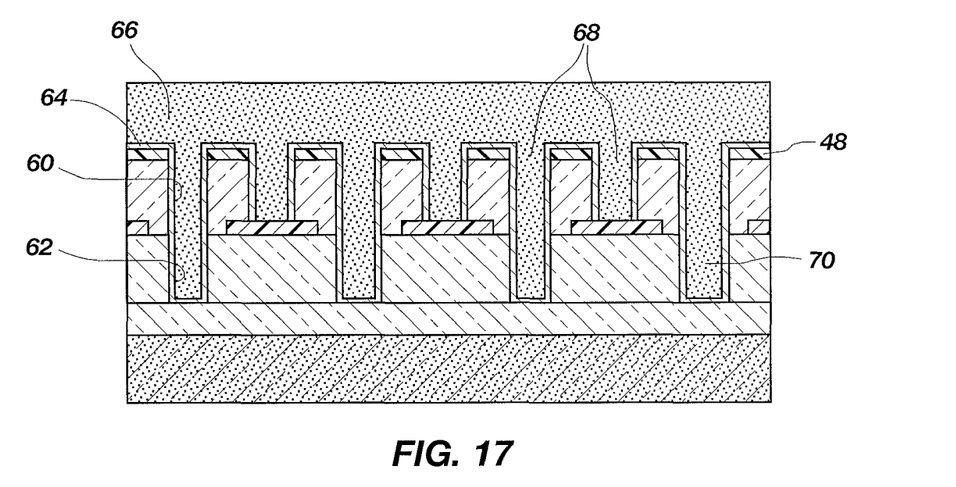

With reference now to FIG. 17, one or more conductive materials may be introduced into contact holes 62 and trenches 60. In the illustrated example, an initial film 64 of conductive material is formed over the exposed surfaces of each contact hole 62, each trench 60, and hard mask layer 48. Thereafter, a conformal layer 66 of conductive material may be formed over initial film 64 to substantially fill each contact hole 62 and each trench 60. Alternatively, hard mask layer 48 may be removed (e.g., by suitable etching processes) prior to the formation of initial film 64.

By way of nonlimiting example only, initial film 64 may comprise a layer of seed material (e.g., titanium nitride (TiN), etc.), which may enhance or facilitate the adhesion of a material of conformal layer 66 (e.g., tungsten, copper, aluminum, nickel, etc.) to the surfaces of contact holes 62 and trenches 60. Alternatively, initial film 64 may be formed from a material (e.g., tungsten, tungsten nitride (WN), a metal silicide, tantalum nitride (TaN) (for use with copper (Cu)), etc.) that acts as a barrier (e.g., to prevent diffusion or interdiffusion, to reduce contact resistance, etc.) between material at the surfaces of contact holes 62 or trenches 60 and the material (e.g., aluminum (Al), copper (Cu), etc.) of conformal layer 66. In view of the extremely small dimensions of the surfaces of contact holes 62 and trenches 60 that are to be coated with initial film 64, initial film 64 may be extremely thin (e.g., about 5 nm). Known processes, including, but not limited to, pulsed chemical vapor deposition (CVD) and atomic layer deposition (ALD) techniques may be used to form initial film 64 and conformal layer 66.

The conductive material within each contact hole 62 forms a conductive contact 70, whereas the conductive material within each trench 60, once it is isolated from the conductive material in adjacent trenches 60, forms a conductive line 68, as illustrated in FIG. 18. Adjacent conductive lines 68 may be physically and electrically separated from one another by removing conductive material from above a plane that extends across the surfaces of the remaining portions of hard mask layer 48. Without limiting the scope of the present invention, such removal may be effected by way of a polishing or planarization process (e.g., mechanical polishing, chemical-mechanical polishing, etc.) that removes the conductive material or materials (e.g., of initial film 64 and conformal layer 66—FIG. 17) with at least some selectivity over (i.e., at a faster rate than) the material of materials of hard mask layer 48. Alternatively, a timed, selective etch process may be employed to remove conductive material (i.e., removal of conformal layer 66 and initial film 64 with selectivity over hard mask layer 48). Thus, hard mask layer 48 may also serve as a polish stop or an etch stop.

Once conductive lines 68 have been physically and electrically isolated from one another, hard mask layer 48 (FIG. 18), if still present, may be removed, as depicted in FIG. 19. Removal of hard mask layer 48 may eliminate any remnants of or material residue from initial film 64 or conformal layer 66 (FIG. 17) that might otherwise result in electrical shorting or leakage between adjacent conductive lines 68. Hard mask layer 48 may be removed by any suitable process, including wet or dry etch processes. The removal process may have selectivity for the material of hard mask layer 48 over the materials of conductive lines 68 and dielectric layer 46.

An example of a semiconductor device 1 that incorporates teachings of the present invention is shown in FIG. 20. Semiconductor device 1 includes a semiconductor substrate 10 with parallel active areas 12 extending into and out of the plane of the drawing sheet. A contact plug 14, which is included in a structural layer 32, is positioned over and communicates electrically with each active area 12. Only half of the contact plugs 14 of the section of semiconductor device 1 that is shown are depicted, however, as the contact plugs 14 of a row of substantially in-line contact plugs 14 correspond to every other active area 12. Another row of substantially in-line contact plugs 14 may be located just behind or just in front of the plane of the drawing sheet. Contact plugs 14 are laterally surrounded and electrically isolated from one another by an insulative material 33 (e.g., doped or undoped silicon dioxide, etc.), which is also a part of structural layer 32.

Insulative layer 34 is located above the plane in which a top surface 15 of each contact plug 14 resides. Contact holes 62, in which conductive contacts 70 are located, extend through insulative layer 34, with a bottom end 20' of each contact hole 62 and the corresponding portion of each conductive contact 70 being located adjacent to top surface 15 of a corresponding contact plug 14. As shown, contact holes 62 may taper inwardly from the top ends 18' thereof to the bottom ends 20 thereof.

In addition to extending through insulative layer 34, conductive contacts may extend through apertures 37 in etch stop layer 36, which is located above insulative layer 34. Dielectric layer 46 is located over etch stop layer 36. Elongate trenches 60, which are depicted as extending into and out of the plane of the drawing sheet, carry conductive lines 68. As illustrated, each conductive line 68 is electrically connected to at least one corresponding conductive contact 70 at the location where that conductive contact 70 extends through an aperture 37 of etch stop layer 36.

Processes and structures that incorporate teachings of the present invention may facilitate the use of lithography apparatus with semiconductor devices with which such lithography apparatus could not otherwise be used. For example, lithography apparatus have alignment tolerance limits that are typically a fraction or percentage of a minimum feature size with which they may be employed (e.g., one-third of a 50 nm minimum feature size). By use of the inventive processes, however, lithography apparatus may be employed in fabricating features that will align with features of much smaller dimensions and alignment tolerances, effectively increasing the alignment tolerances of lithography apparatus.

Although the foregoing description contains many specifics, these should not be construed as limiting the scope of the present invention, but merely as providing illustrations of some of the presently preferred embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions and modifications to the invention as disclosed herein, which fall within the meaning and scope of the claims, are to be embraced thereby.

What is claimed:

1. A semiconductor device structure, comprising:
    a plurality of active-device regions having a first pitch;
    a first row of substantially aligned contacts spaced at a second pitch that exceeds the first pitch, each contact of the first row of substantially aligned contacts comprising:
        a lower contact plug contacting a corresponding active-device region and including:
            a narrow base, with a distance across the narrow base being about the same as a corresponding distance across the corresponding active-device region; and
            a wide upper surface, with a distance across the wide upper surface being at least about twice the distance across the narrow base; and
        an upper contact plug above the lower contact plug, with a base of the upper contact plug contacting the wide upper surface of the lower contact plug, a distance across the base of the upper contact plug being smaller than the distance across the wide upper surface of the lower contact plug; and
    a second row of substantially aligned contacts laterally offset from the first row of substantially aligned contacts and spaced at the second pitch.

2. The semiconductor device structure of claim 1, wherein the second pitch is about twice the first pitch.

3. The semiconductor device structure of claim 2, wherein the first pitch is at most about 100 nm and the second pitch is at most about 200 nm.

4. The semiconductor device structure of claim 2, wherein the first pitch is about 20 nm and the second pitch is about 40 nm.

5. The semiconductor device structure of claim 1, wherein the lower contact plug of each contact of the first row of contacts includes a lower section and an upper section.

6. The semiconductor device structure of claim 1, wherein the wide upper surface of the lower contact plug has dimensions configured to facilitate registration or minimize contact resistance with the base of the upper contact plug.

7. The semiconductor device structure of claim 6, wherein a distance across the base of the upper contact plug is at most about 50 nm.

8. The semiconductor device structure of claim 6, wherein a distance across the base of the upper contact plug is at least about 30 nm.

9. The semiconductor device structure of claim 6, wherein a distance across the base of the upper contact plug is about 10 nm.

10. The semiconductor device structure of claim 1, further comprising:
    a plurality of bit lines extending in substantial mutually parallel relation and spaced at about the first pitch.

11. The semiconductor device structure of claim 10, wherein each bit line of the plurality of bit lines is positioned substantially over a corresponding active-device region.

12. The semiconductor device structure of claim 10, wherein each bit line of the plurality of bit lines comprises at least one of tungsten, copper, aluminum, and nickel.

13. The semiconductor device structure of claim 1, further comprising a layer of etch stop material through which each contact of the first and second rows of substantially aligned contacts extend.

14. The semiconductor device structure of claim 1, wherein at least one contact of the first and second rows of substantially aligned contacts comprises at least one of tungsten, copper, aluminum, and nickel.

15. A semiconductor device structure, comprising:
    a substrate with a plurality of active-device regions arranged at a first pitch;
    an insulative structure contacting an active surface of the substrate; and
    an etch stop layer formed from a material that resists removal by an etchant that removes material from the insulative structure, the etch stop layer contacting a surface of the insulative structure and including at least two substantially in-line rows of apertures formed therein, the at least two substantially in-line rows of apertures aligned over corresponding active-device regions of the plurality of active-device regions, at least one row of apertures of the at least two substantially in-line rows of apertures being laterally offset from an adjacent row of apertures of the at least two substantially in-line rows of apertures, wherein apertures of each row have a second pitch that is about twice the first pitch, wherein at least one aperture of the at least two substantially in-line rows of apertures is substantially aligned with a contact aperture formed through the insulative structure, the contact aperture having a narrow base and a wide upper portion, a distance across the narrow base being about half or less than half of a distance across the wide upper portion, and wherein a distance across a base of the at least one aperture of the at least two substantially in-line rows of apertures is smaller than the distance across the wide upper portion of the contact aperture.

16. The semiconductor device structure of claim 15, further comprising:
    a dielectric layer over the etch stop layer, the dielectric layer including features that extend into the apertures of the etch stop layer;
    a plurality of laterally extending trenches formed in the dielectric layer, with portions of the bottom surfaces of the plurality of laterally extending trenches being defined by portions of the etch stop layer; and
    a plurality of contact holes formed within the insulative structure, the plurality of contact holes being aligned with apertures of the etch stop layer and extending into the insulative structure from trenches of the plurality of laterally extending trenches.

17. The semiconductor device structure of claim 15, further comprising:
a dielectric layer over the etch stop layer, the dielectric layer including features that extend into the apertures of the etch stop layer;
a hard mask over the dielectric layer and including elongate solid regions aligned between adjacent active-device regions of the plurality of active-device regions of the substrate.

18. The semiconductor device structure of claim 15, further comprising:
a dielectric layer over the etch stop layer, the dielectric layer including features that extend into the apertures of the etch stop layer;
a hard mask layer over the dielectric layer; and
a spacer mask over the hard mask layer and including elongate solid regions aligned between adjacent active-device regions of the plurality of active-device regions of the substrate.

* * * * *